United States Patent
Pellegrini et al.

(10) Patent No.: US 7,089,528 B2
(45) Date of Patent: Aug. 8, 2006

(54) METHODS AND SYSTEMS FOR ESTIMATING RETICLE BIAS STATES

(75) Inventors: Joseph Pellegrini, Cohasset, MA (US); David Crow, Maple Grove, MN (US)

(73) Assignee: International Business Machines Corporation, Armonk, NY (US)

( * ) Notice: Subject to any disclaimer, the term of this patent is extended or adjusted under 35 U.S.C. 154(b) by 397 days.

(21) Appl. No.: 10/723,640

(22) Filed: Nov. 26, 2003

(65) Prior Publication Data
US 2004/0181728 A1   Sep. 16, 2004

Related U.S. Application Data

(60) Provisional application No. 60/453,774, filed on Mar. 11, 2003.

(51) Int. Cl.
*G06F 17/50* (2006.01)

(52) U.S. Cl. .......................... 716/19; 716/21

(58) Field of Classification Search ............ 716/19–21; 430/5
See application file for complete search history.

(56) References Cited

U.S. PATENT DOCUMENTS

| | | | |
|---|---|---|---|
| 6,429,930 B1 | 8/2002 | Littau et al. | 124/356 |
| 6,453,457 B1 | 9/2002 | Pierrat et al. | 716/19 |
| 6,513,151 B1* | 1/2003 | Erhardt et al. | 716/21 |
| 6,526,164 B1 | 2/2003 | Mansfield et al. | 144/382 |
| 2003/0138706 A1 | 7/2003 | Progler et al. | 5/430 |
| 2005/0216877 A1* | 9/2005 | Pack et al. | 716/19 |

* cited by examiner

*Primary Examiner*—Paul Dinh
(74) *Attorney, Agent, or Firm*—Steven Capella (57) ABSTRACT

Disclosed are methods and systems for estimating a reticle bias state for a process system, that include computing a difference between control data provided to the process system and error data based on a process system output(s), and estimating the reticle bias state based on weighted measures associated with the control data, the weighted measures being based on the number of data points included in the difference. The methods and systems include associating the reticle bias state estimate with a first quality factor, computing at least one weighted measure based on a number of data elements associated with the reticle, using the weighted measure(s) to provide a computed reticle bias state estimate and an associated computed quality factor, and, comparing the computed quality factor with the first quality factor to determine whether to update the reticle bias state estimate with the computed reticle bias state estimate.

15 Claims, 4 Drawing Sheets

METHODS AND SYSTEMS FOR ESTIMATING RETICLE BIAS STATES

CLAIM OF PRIORITY

This application claims priority of U.S. Ser. No. 60/453,774, entitled "method to Automate State Estimates of Reticle Offsets in Microlithography Semiconductor Manufacturing," filed on Mar. 11, 2003, naming Joseph C. Pellegrini and David Crow as inventors, the contents of which are herein incorporated by reference in their entirety.

BACKGROUND (1) Field

The disclosed methods and systems relate generally to control techniques, and more particularly to control systems for materials manufacturing processes such as semiconductor manufacturing processes.

(2) Description of Relevant Art

Lithography is a process used in semiconductor manufacturing to transfer a circuit pattern from a photomask or reticle to a semiconductor wafer, or more specifically, to transfer the photomask pattern to a layer of resist that has been deposited on the wafer surface, where the resist is sensitive to irradiation. Different types of lithography can be based on the wavelength of the radiation used to expose the resist. For example, photolithography, otherwise known as optical lithography, uses ultraviolet (UV) radiation and a corresponding UV-sensitive resist. Ion beam lithography uses a resist sensitive to an ion beam, electron beam lithography uses a resist film sensitive to a scanning beam of electrons to deposit energy therein, and X-ray lithography uses a resist sensitive to X-rays.

Photolithography employs a photomask that can be understood to be a quartz plate that is transparent to UV radiation and includes a master copy of an integrated circuit that is often a microscopic integrated circuit. The photomask can be used to block resist exposure to select areas using chrome opaque areas.

A stepper is a resist exposure tool used in many photolithography systems to expose part of the wafer or resist in a given exposure. Systems employing a stepper can require a "step-and-repeat" process to expose the entire wafer as desired. A scanner is another type of resist exposure tool used in photolithography systems to expose part of the wafer or resist in a given exposure. Systems employing a scanner can require a "step-and-scan" process to expose the entire wafer as desired. In the aforementioned systems, overlay can be understood as the superposition of the pattern on the mask to a reference pattern previously created on the wafer surface. Related to overlay is alignment, which can be understood to be including positioning, or aligning, the mask or reticle relative to markers or targets on the wafer, prior to the exposure. Accordingly, to achieve proper exposure, overlay and alignment, among other parameters, must be properly controlled.

As the demand for smaller and more complex circuits increases, there is similarly increased demand for monitoring and hence improving overlay and alignment errors. Contributing to such errors can be the x-alignment of the wafer, the y-alignment of the wafer, the scale error or ratio of desired to actual stage movement in the x and y directions, the rotational error of the wafer, the reticle magnification error, and the reticle rotation error, among others.

To reduce these errors, it may be desirable to estimate reticle bias states related to overlay and critical dimension.

SUMMARY

Disclosed are methods and systems for estimating a reticle bias state for a process system, that include computing a difference between control data provided to the process system and error data based on at least one output of the process system, and estimating the reticle bias state based on weighted measures associated with the control data, where the weighted measures are based on the number of data points included in the difference. The weighted measures can include normalized weighted measures, where such weighted measures can be based on the square root of the number of data points included in the difference. In some embodiments, the weighted measures are multiplied by a constant factor.

As disclosed, the methods and systems can also include normalizing the reticle bias state estimate, where the normalizing can be based on a sum of the weighted measures.

In some embodiments, the reticle bias state estimate can be associated with a quality factor. The quality factor can be based on a sum of the squares of the weighted measures. In an embodiment, the quality factor can be based on a square root of a sum of the squares of the weighted measures. The associated quality factor can be compared with at least one threshold. In one embodiment, the threshold(s) can include a use threshold to determine whether to provide the reticle bias state estimate to the process system, and/or a stop-learning threshold to determine whether to continue updating the reticle bias state estimate.

The disclosed methods and systems can include comparing the associated quality factor with a previously computed quality factor associated with a previously computed reticle bias state estimate, where the previously computed reticle bias state estimate corresponds to the same reticle as the associated quality factor. Based on the comparing, the previously computed quality factor associated reticle bias state estimate may be updated. Accordingly, the methods and systems can include performing a second comparing between the associated quality factor and at least one threshold, where the threshold(s) can include a use threshold to determine whether to provide the reticle bias state estimate to the process system, and/or a stop-learning threshold to determine whether to continue updating the reticle bias state estimate.

Also disclosed are methods and systems that for updating and/or computing a reticle bias state estimate. The methods and systems can include associating a reticle bias state estimate with a first quality factor, computing at least one weighted measure based on a number of data elements associated with the reticle, using the at least one weighted measure to provide a computed reticle bias state estimate and an associated computed quality factor, and, comparing the computed quality factor with the first quality factor to determine whether to update the reticle bias state estimate with the computed reticle bias state estimate.

The comparing can include comparing the computed reticle bias state estimate to a use threshold to determine whether to use the computed reticle bias state estimate. The comparing can also include comparing the computed reticle bias state estimate to a stop-learning threshold. The comparing can include updating the first quality factor with the computed quality factor and updating the reticle bias state estimate with the computed reticle bias state estimate, when the computed quality factor exceeds the first quality factor.

The disclosed methods and systems can include setting the first quality factor to a value to cause a least one of: an update to the reticle bias state estimate, no update to the reticle bias state estimate, and no use of the reticle bias state estimate.

In one embodiment, the weighted measure can be based on the square root of the number of data elements associated with the reticle. Accordingly, computing the weighted measure(s) can include computing the weighted measure(s) for each of different queries associated with the reticle, and, normalizing the weighted measure(s) to provide at least one normalized weighted measure.

The methods and systems can include using the weighted measure(s) such that a largest normalized weighted measure is identified, and, based on the largest normalized weighted measure, a computed reticle bias state estimate is generated.

In one embodiment, the methods and systems can include computing a quality factor based on a sum of the squares of the weighted measures(s).

It can be understood that the reticle bias state estimate can be provided to a process system that can include a lithography system and/or a microlithography system. Accordingly, the disclosed methods and systems can further include measuring at least one process system error in providing a wafer to an overlay metrology system. Measuring the process system error can include, for example, providing measurements associated with at least one of: an x-translation, a y-translation, an x-scaling, a y-scaling, a wafer rotation, a non-orthogonality, a reticle magnification, an asymmetric reticle magnification, a reticle rotation, and an asymmetric reticle rotation.

Other objects and advantages will become apparent hereinafter in view of the specification and drawings.

DESCRIPTION

To provide an overall understanding, certain illustrative embodiments will now be described; however, it will be understood by one of ordinary skill in the art that the systems and methods described herein can be adapted and modified to provide systems and methods for other suitable applications and that other additions and modifications can be made without departing from the scope of the systems and methods described herein.

Unless otherwise specified, the illustrated embodiments can be understood as providing exemplary features of varying detail of certain embodiments, and therefore, unless otherwise specified, features, components, modules, and/or aspects of the illustrations can be otherwise combined, separated, interchanged, and/or rearranged without departing from the disclosed systems or methods. Additionally, the shapes and sizes of components are also exemplary and unless otherwise specified, can be altered without affecting the disclosed systems or methods.

For the disclosed methods and systems, references to a reticle can include a mask and a photomask, and variations thereof. Further, references to a database can be understood to be a memory that can be capable of associating memory elements.

References herein to controlling a reticle-induced error(s) in a process system can be understood to include controlling errors in a process system that may physically employ or otherwise include a reticle, and/or process systems that may be affected by reticle characteristics (e.g., errors), regardless of whether a reticle is employed or actually physically included in the process system. The disclosed process systems can thus be understood to be associated with at least one reticle, where the such reticle(s) can be further associated with at least one reticle error. Accordingly, references herein to "the process system reticle," etc., can be understood to be the one or more reticles whose errors can affect the process system, regardless of whether the reticle(s) may be physically present in the process system.

Figure 1:
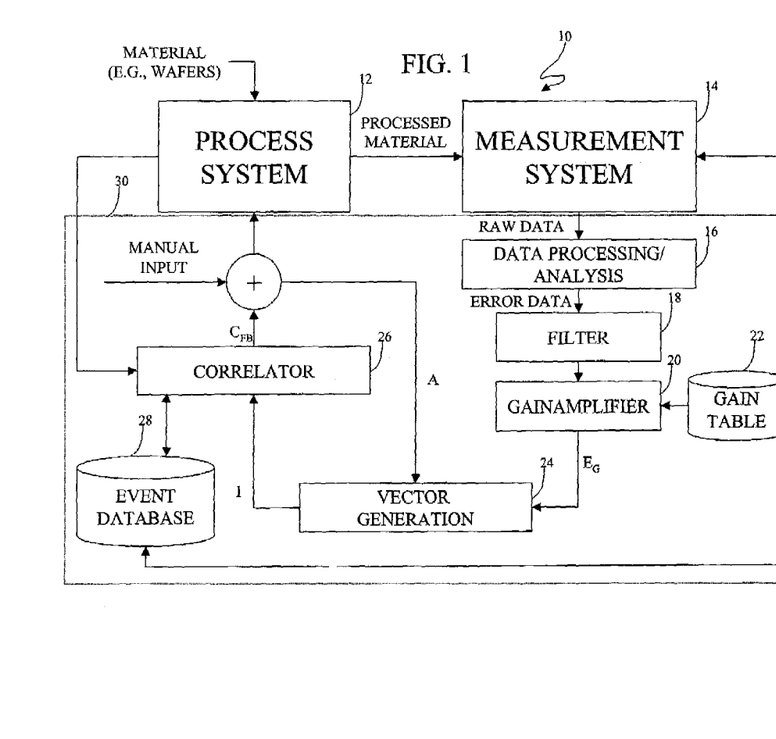
FIG. 1 illustrates a control system using feedback.

FIG. 1 provides one illustrative depiction of a system 10 that includes a process system that can be affected by reticle-induced errors, in an embodiment that can be associated with semiconductor manufacturing. It can thus be understood that the general concepts discussed relative to Figure can be applicable to the systems and methods of FIGS. 2 and 3, for example, although such concepts may not otherwise be illustrated therein, and unless such concepts are otherwise controverted and/or disclaimed with respect to such other Figures. In accordance with FIG. 1, materials such as semiconductor wafers can be input to a process system 12 and hence to a measurement system 14. The illustrated process system 12 can be, for example, a system that performs lithography, chemical mechanical polish (CMP), diffusion, thin film, metal deposition, ion implantation, etching, or another process system. The illustrated measurement system 14 can be, for example, a metrology system such as an overlay measurement system or tool, a critical dimension measurement tool, a thickness measurement tool, a film reflectivity measurement tool, or another measurement tool or system. Accordingly, for one such embodiment based on FIG. 1, semiconductor wafers can be presented to a photolithography system 12 and thereafter to an overlay measurement tool 14 that provides measurements based on the processed wafers.

As shown in FIG. 1, raw data from the measurement system 14 can be provided for processing and/or analysis 16, where the raw data can include measurements from the measurement system 14, configuration data (e.g., component identifiers, system identifiers, etc.) based on the process system 12 and/or the measurement system 14, and other data (e.g., date, time, etc.). For a system according to FIG. 1, a data processing/analysis module 16 can be based on the process system 12 such that the output of the data processing/analysis module 16 can be configured to provide data in a form that can be used by and/or is otherwise compatible with the process system 12. In some systems, for example, the data processing/analysis module 16 can include modules for modeling and/or otherwise estimating at least some components and/or processes of the process system 12. In an illustrative embodiment where the process system 12 can be a lithography system and the measurement system 14 can be an overlay measurement system, the data processing/analysis module 16 can include, for example, least square regression models for components of the lithography system 12. Those with ordinary skill in the art will recognize that such models and/or estimation modules are not limited to least square regression models, and other estimation and/or modeling techniques can be used without departing from the scope of the disclosed methods and systems.

In the illustrated embodiments, the data processing/analysis module 16 can provide error signals and/or data as output. Accordingly, in an embodiment based on the aforementioned lithography system, the data processing/analysis module 16 can provide error data that can include errors based on, for example, x-translation, y-translation, x-scaling, y-scaling, wafer rotation, grid non-orthogonality, reticle magnification, reticle rotation, and/or others, where those of ordinary skill in the art will recognize that such error signals are merely for illustration and not limitation, and some embodiments may include fewer and/or more error data, where the error data can be in either analog and/or digital form. Unless otherwise provided herein, the data throughout the disclosed embodiments and the disclosed methods and systems can be understood to be in either digital or analog form without departing from the scope of the disclosed methods and systems.

Although the data processing/analysis module 16 is not limited to providing error data as output, for the discussion herein, such module's output can be referred to collectively as error data, where such error data can also include data based on the configuration of the process system 12 and/or the measurement system 14, and/or other data. To facilitate an understanding of systems and methods according to FIG. 1, the error data can be understood to include an error vector that can have at least one row and at least one column, where the size of the error vector can be based on the process system 12 and/or the measurement system 14.

Systems and methods according to FIG. 1 can also include a filter 18 that can operate on data based on the data processing/analysis output, and filter such data based on fixed and/or variable criteria. A system administrator, user, or another can establish or otherwise provide the filter criteria. In one illustrative system, the filter 18 can be based on user-defined rules that can qualify the filter input data to determine whether such filter input data should be employed for controlling and/or otherwise characterizing the process system 12. The filter 18 may be viewed as providing a condition for utilizing the input data to characterize the process system 12. For example, the filter 18 can distinguish data based on a number of successfully measured raw data points provided by the measurement system 14, where the number can be user-specified in some embodiments. In one embodiment, if a specified number of successfully measured raw data points are not provided, the data can be distinguished as inappropriate for feedback to the process system 12 in accordance with a system based on FIG. 1. Additionally and/or optionally, the filter 18 can route or otherwise distinguish or classify data based on data markers, flags, or other data that can indicate that the data input to the filter 18 can be ignored or may otherwise be inappropriate for feedback to the process system 12. In one example, the error data can be marked or otherwise designated as being associated with a special event. In some embodiments, the filter 18 can include validation rules that can be applied to the data input to the filter 18. In illustrative systems, the filter 18 can include statistical and/or other filtering techniques that can include, for example, classification techniques such as Bayesian classifiers and neural networks.

Systems and methods according to FIG. 1 can also include a gain amplifier 20 that can be a variable gain amplifier. A gain table 22 can accordingly provide stored gain values that adjust data based on the filtered error vector to compensate for scaling, sign differences, and other process system 12 and/or measurement system 14 characteristics. A gain amplifier output, Eg, can be provided to a vector generation module 24 that can provide a different between: (a) data representing actual control data (offsets, commands, etc.), A, provided to the process system 12; and, (b) the gain amplifier output, Eg. The difference vector I=A−Eg, can be understood to represent an actual control to the process system 12, less the errors generated by such control. Those of ordinary skill in the art will recognize that the delay in providing the actual control, A, and receiving the error vectors, Eg, can be one the order of seconds, minutes, hours, or days.

Data based on the difference vector I can be provided to a correlator module 26 that identifies and processes data from events having similar process system 12 characteristics. For example, for a given process system 12, events having similar characteristics can include events that are process using similar configurations of the process system 12 and/or measurement system 14. In an embodiment where the process system 12 can be a lithography system and the measurement system 14 can be an overlay measurement system, for example, characteristics can include a lithography system identifier, a reticle identifier, a routing identifier (e.g., material used in processing), an operation identifier (e.g., operation being performed), a process level identifier (e.g., stage of processing), an exposure tool identifier, and/or a part number, although such examples are provided for illustration and not limitation, and fewer and/or more system characteristics can be used to characterize an event. An event database 28 or other memory component can thus include historical measurement data that can be provided by the measurement process 14 and thereafter be accessed by or otherwise integrated with the correlator module 26 to allow a feedback control and/or command vector, $C_{FB}$, to be computed based on a historical evaluation of similar process system 12 and/or measurement system 14 configurations. In some embodiments, $C_{FB}$ can provide incremental control/commands to the process system 12, while in some embodiments, $C_{FB}$ can provide an absolute control/command to the process system 12. Those of ordinary skill in the art will recognize that in the illustrate embodiment, the dimension of $C_{FB}$ can be based on or be the same as Eg, as the commands provided by $C_{FB}$ can be associated with the process system components for which error data can be obtained.

In some embodiments, event database data can be associated and/or correlated to facilitate queries of the event database 28. In the illustrated system, the event database 28 can associate actual command data, A, and gain amplifier outputs, Eg, with "correlation keys" that represent process system characteristics, and can otherwise be understood to be query and/or index terms. Accordingly, as shown in FIG. 1, the correlator module 26 can provide a command vector, $C_{FB}$, to the process system 12, where $C_{FB}$ can be based on a query of the event database 28 and associated I vector data that can be based on the query. The event database query can otherwise be understood to be a "feedback request," and as provided herein, can be based on correlation keys or process system characteristics.

One of ordinary skill will recognize that although not explicitly indicated in the illustrated embodiments, the event database 28 can include actual command data A, and gain amplifier outputs $E_g$ that may otherwise be understood as errors. Accordingly, an ideal vector, or difference vector, I, can be recreated from respective A and $E_g$ data.

In one embodiment, the command vector, $C_{FB}$, can be based on a weighted moving average ("WMA") of historical difference vectors (e.g., "I vectors") that can be further based on similar process system characteristics and included in the event database 28. The weighted moving average can also be based on a user-specified time-period that can specify a time over which the I vector data can be collected for incorporation into, for example, a weighted moving average. The weighted moving average can be based on fixed and/or variable weights that can be specified by a user, for example. As provided previously herein, in some embodiments, the command vector can be of the same dimension as the gain amplifier output, Eg, and can include similar vector elements. For example, in accordance with a process system 12 that includes a lithography system or tool, a command vector may include at least one control associated with at least one o an x-translation error, a y-translation error, an x-scaling error, a y-scaling error, a wafer rotation error, a nonotherogonality error, an asymmetric magnification error, an asymmetry rotation error, a reticle rotation error, a reticle magnification error, a critical dimension (CD) linewidth bias, a dose bias, a reticle density, a mask density, a frame-to-frame alignment, a distance from optical center to frame center, an alignment mark line size, an alignment mark density, and an alignment mark duty cycle, although such examples are provided for illustration and not limitation.

The illustrated event database 28 can employ a commercially available database (e.g., SQL, Informix, Oracle, Access, etc.) or another system for associating data and allowing such associated data to be queried and/or retrieved according to the methods and systems disclosed herein. In an embodiment where the process system 12 includes a lithography system, the event database 28 can be arranged to associate data based on, for example, process system characteristics and/or other correlation keys that can include a technology identifier (e.g., type of processor, operating system, etc.), a reticle identifier, a route identifier, an operation identifier, a process level identifier, an exposure tool identifier, and/or a part number, although such examples are merely illustrative, and some embodiments can use fewer and/or more identifiers or process system characteristics.

The correlator module 26 can thus also include or otherwise provide for rules for querying the event database 28. In an embodiment, a user and/or system administrator can provide default query rules that can be modified using, for example, an interface such as a graphical user interface (GUI). For example, a user may provide the correlator module 26 with a hierarchy of query criteria and filter criteria such that one or more correlation keys or query criteria can be eliminated from the query or otherwise presented as a wildcard in the query if the filtered query results are not sufficient. Accordingly, query results can be filtered based on default and/or user-specified criteria that can include, for example, a minimum number of query results, a maximum number of query results, a time period within which the data may have been collected, and/or a type of weighting average to apply. In an embodiment, if the filtered query results are inadequate to allow for a computation of the control/command vector, $C_{FB}$, the disclosed methods and systems can allow for a wildcarding of system parameters based on a user's hierarchical wildcarding configuration. Such a system can thus perform several feedback requests or database queries and filterings before obtaining query results sufficient for computing $C_{FB}$.

In one example, a user may query the event database 28 based on process system characteristics that include a technology identifier (ID), a routing identifier (ID), a process level identifier (ID), an operation identifier (ID), a device (or part number) identifier (ID), a reticle identifier (ID), an exposure tool identifier (ID), and/or another process system characteristic. The query may further specify or it may otherwise be known that the data satisfying such process system characteristics must be within a time period in the last M weeks, and further, at least N data points must be collected for a valid retrieval. Because the criteria for N data points within the past M weeks may not be satisfied in an initial query, the user may decide to wildcard, for example, the exposure tool ID criteria to potentially allow further data points (i.e., satisfying the query regarding process system characteristics other than exposure tool ID). If N data points within M weeks are not retrieved after querying without employing exposure tool ID, the user may specify that the next process system criteria to be eliminated from the query may be reticle ID. Those of ordinary skill in the art will recognize this example as providing an illustration of the aforementioned hierarchical wildcarding, where query terms and/or correlation keys can be specified as employing an exact match (e.g., Windows 2000 operating system), a partial wildcard (e.g., a Windows operating system), or a complete wildcard (e.g., operating system not relevant). As provided herein, the user can additionally and optionally establish a hierarchical rule for invoking the wildcards (e.g., in the example herein, exposure tool ID was ranked as the first parameter to wildcard, followed by reticle ID, etc.).

In some cases, the wildcarding process may not provide sufficient query results for allowing a computation of $C_{FB}$. In an embodiment, a user or another can be alerted or otherwise informed when $C_{FB}$ cannot be computed because of insufficient query results, and such condition may require a manual adjustment to a system according to FIG. 1.

As illustrated in FIG. 1, some embodiments can allow a user or another to provide a manual input (e.g., user-specified input) to override or otherwise compensate the command vector, $C_{FB}$. Accordingly, a system based on the illustrated control system 30 can include one or more processor-controlled devices that can interface to the process system 12 and the measurement system 14, where a user, system administrator, or another, referred to throughout herein collectively as a user, can access data at various stages of the control system 30 via a user interface (e.g., GUI, operation system prompt) and utilize one or more peripheral devices (e.g., memory, keyboard, stylus, speaker/voice, touchpad, etc.) to provide input or otherwise alter data at various stages of the control system 30. A user can also utilize tools that can be incorporated into or otherwise interface with the control system 30 to analyze or otherwise view data at various stages of the control system 30, where such analysis can be performed in real-time and/or off-line. Accordingly, changes to the components of such a control system 30 can be performed in real-time and/or off-line.

Those of ordinary skill in the art will recognize that in an example where the FIG. 1 process system 12 can be a lithographic system and the measurement system 14 can be an overlay measurement tool, the lithographic system 12 can be configured by a user to query for data from the correlator module 26 and/or event database 28 to provide an initial command vector, $C_{FB}$, where such query can also include or otherwise be based on process system characteristics, hierarchical rules, wildcarding, and/or other criteria. Based on the filtered query results, a $C_{FB}$ can be provided for an initial wafer. If a $C_{FB}$ cannot be computed based on a lack of filtered query results, systems and methods according to FIG. 1 may cause a "send-ahead" wafer to allow processing and measurements upon which control can be provided. Using send-ahead wafers and other such techniques can be costly and can adversely affect the throughput of the methods and systems. As provided herein, to reduce the occurrences of ineffective queries and hence "send-ahead" wafers, users may devise a query that wildcards enough process system characteristics to obtain a desired number of query results to provide an initial $C_{FB}$, but such wildcarding techniques can cause incompatible data (e.g., based on different process system characteristics from that presently occurring in the process system 12) to be included in the $C_{FB}$ computation, and hence the ineffective in providing the desired control. For example, a user can wildcard reticle ID, thus allowing the query to combine (e.g., compute a weighted moving average) based on different reticle IDs. In this example, because different reticles have different reticle errors, such errors remain uncompensated, and hence can combine in undesirable manners to induce undesirable system performance, particularly when the process system 12 is presently utilizing or otherwise affected by a specific reticle.

Figure 2:
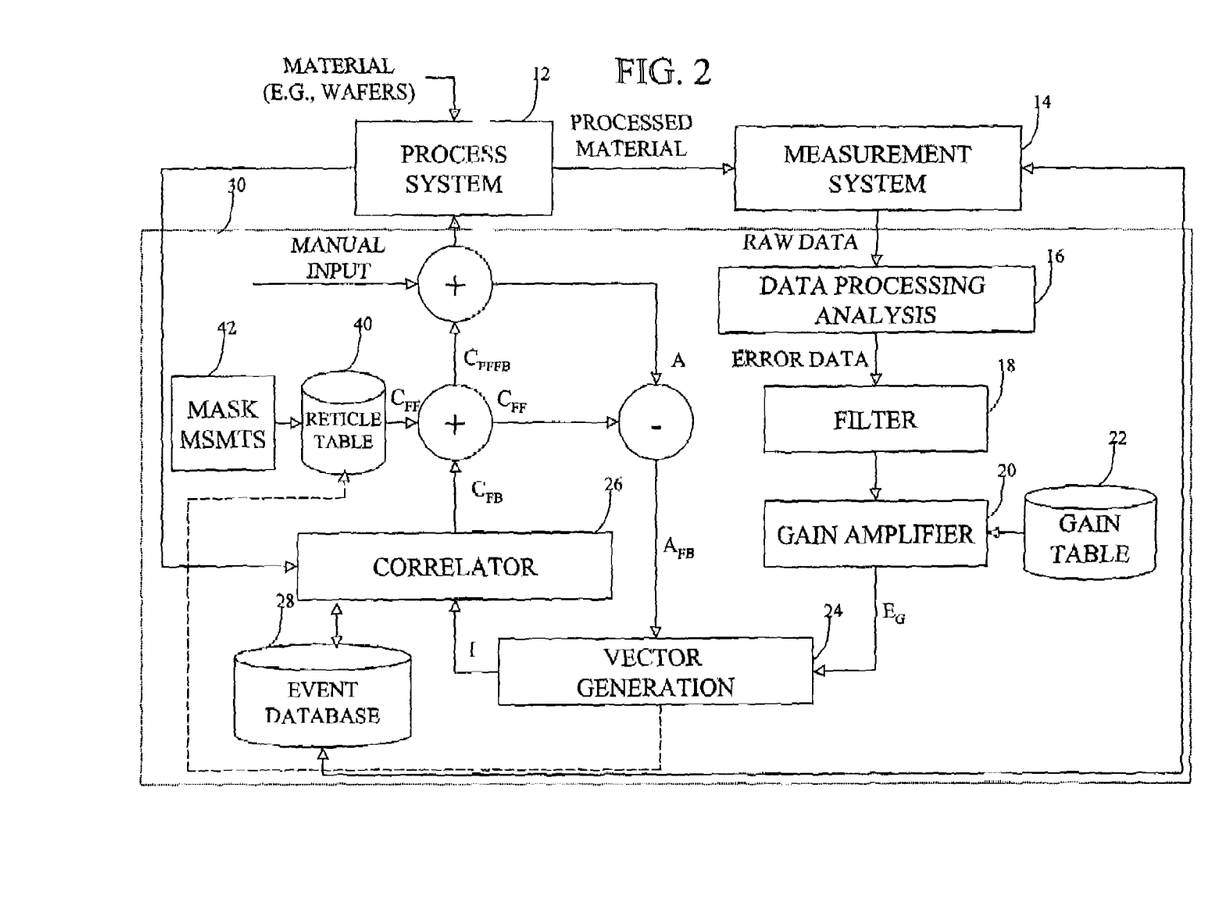
FIG. 2 is an exemplary control system having feedforward and feedback.

FIG. 2 presents one illustrative system and method that can be based on and/or otherwise incorporate features and/or concepts of FIG. 1, and provides additional control for systems and methods according to FIG. 1, where the process system 12 can be a system that can be affected by reticle-induced errors and/or includes a reticle, such as, for example, a lithography and/or photolithography system. Systems and methods according to FIG. 2 can be based on a consideration that photomask or reticle-induced errors can be considered static relative to other process system 12 errors that may be considered dynamic. Accordingly, systems and methods according to FIG. 2 may allow a user to query the event database 28 based on hierarchical rules, wildcarding, etc., as provided previously herein with respect to FIG. 1; however, when such query expands to collect data based on a complete and/or partial wildcard of reticle ID, such that a $C_{FB}$ may be based on data from more than one reticle ID, a system according to FIG. 2 can compensate such data by utilizing a reticle table 40 that can include reticle-induced error data based on reticle ID. As provided herein, the relative static nature of reticle-induced errors compared to other process system characteristics facilitates a compensation as provided in FIG. 2. Systems and methods according to FIG. 2 include a feedforward loop based on the reticle table 40 that allows reticle-induced errors to be deconvolved from dynamic errors of the process system 12 and/or measurement system 14.

Those of ordinary skill in the art will thus recognize that when reticle ID is included as a correlation key (e.g., query item), system configurations that occur infrequently ("short-runners") may provide inadequate query results, and hence cause a manual input to occur. Alternatively, if the reticle ID is eliminated from the query (e.g., wildcarded), the combinations of frequent reticle changes in the process system 12 can cause a command/control vector $C_{FB}$ that can cause uncontrolled disturbances (i.e., disturbances at frequencies greater than the process stream operating frequency) in the process system 12.

The FIG. 2 reticle table 40 can be a memory that associates at least one reticle ID to at least one reticle-induced error, reticle-induced bias, and/or reticle-induces offset, where the term "reticle-induced error" can be understood herein to include a reticle-induced bias, reticle-induced offset, or reticle-induced error, as such terms are known in the art, and where the association can be based on a process system 12 and/or a component of a process system 12. In one embodiment shown in FIG. 2, the reticle table 40 can accept reticle (e.g., photomask) error data from manually and/or automatically entered photomask measurements 42, for example, that can be provided via an interface associated with the control system 30. Such data may be provided from a reticle manufacturer, for example, or from another test, manufacturing, and/or data collection facility. In an embodiment, the reticle table 40 can be updated automatically with data from a system according to FIG. 2 system, as those of ordinary skill in the art will recognize that some components of, for example, $E_g$ and/or I, may be associated with reticle-induced errors, and hence such data may be input to the reticle table 40 for updating reticle-induced errors.

Those or ordinary skill in the art will recognize that the reticle table 40 can also include additional data associations to enhance the data provided by the reticle table 40. Accordingly, processor instructions associated with the control system 30 can cause a query of the reticle table 40 where the query can also be specified by a user to allow hierarchical query terms, wildcard terms, etc., and accordingly, the reticle table can associate reticle-induced errors with, for example, layer IDs, device IDs, route IDs, operation IDs, and/or other process system 12 and/or measurement system 14 characteristics.

In one illustrative embodiment of a reticle table 40, for example, queries can be based on one or more reticle parameters that can include reticle ID, exposure tool ID, device ID, and layer ID. Generally, a reticle table 40 may associate these reticle parameters with one or more reticle-induced errors. As provided herein, those or ordinary skill in the art will recognize that "reticle-induced errors" can include errors in a process system that includes a reticle, can generally be associated with a reticle characteristics, and reticle-induced errors can be based on errors associated with reticle manufacture and/or errors associated with the interaction (e.g., alignment, loading) of a reticle with the process system 12 (e.g., exposure tool). For example, reticle-induced errors can include one or more of an x-translation error, a y-translation error, an x-scaling error, a y-scaling error, a wafer rotation error, a non-orthogonality error, a reticle magnification error, an asymmetric magnification error, a reticle rotation error, an asymmetry rotation error, a critical dimension (CD) linewidth bias, a dose bias, a reticle density, a mask density, a frame-to-frame alignment, a distance from optical center to frame center, an alignment mark line size, an alignment mark density, and an alignment mark duty cycle. Those of ordinary skill will recognize that some of the aforementioned reticle-induced errors may be duplicative depending upon a give definition of an error, and accordingly, such errors are not intended for limitation but for illustration of some reticle-induced errors that can be associated with reticle characteristics and/or biases that can be associated with reticles in a process system 12. Some embodiments may employ one or more of these errors and the number of errors associated with a reticle ID can vary based on system characteristics (e.g., process system 12), reticle ID, and other factors. As provided herein with reference particularly to FIG. 3, the reticle table 40 can include an association of reticle ID with a quality factor, and/or a use threshold, a stop-learning threshold, and/or other criteria associated with a quality factor.

Figure 3:
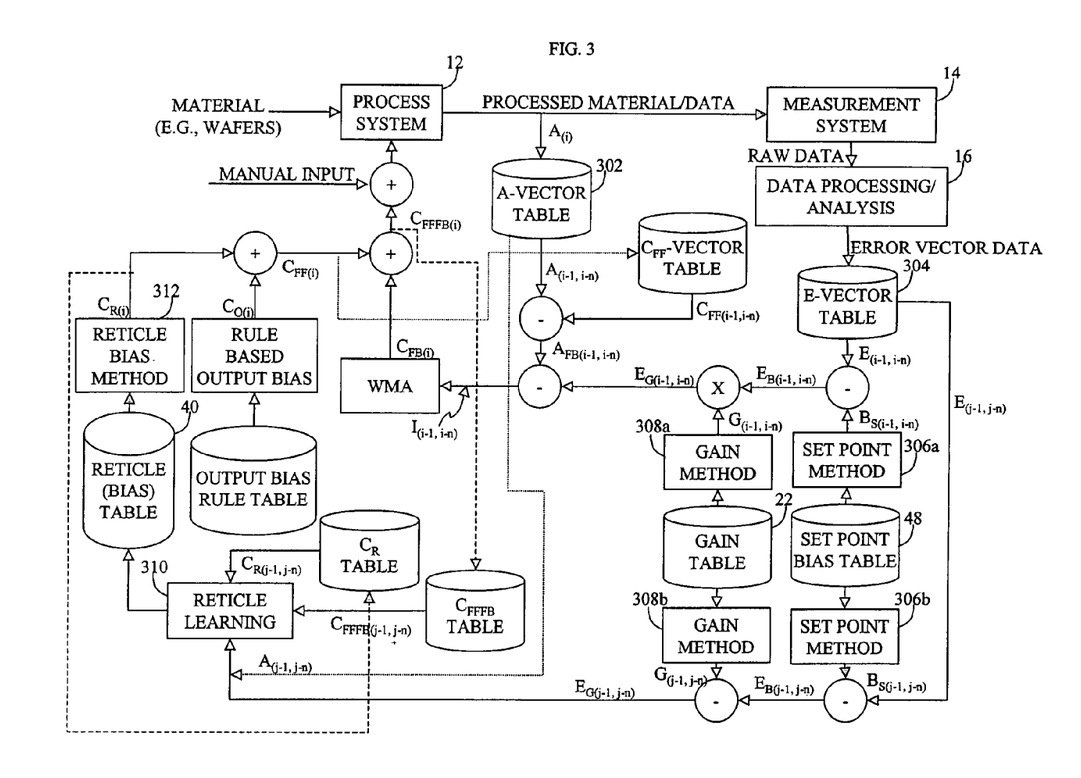
FIG. 3 presents another control system having feedforward and feedback.

As FIG. 2 indicates, the feed-forward correction, $C_{FF}$, can be, for example, based on one or more reticle-induced error values (e.g., vector) from the reticle table 40 and can compensate or otherwise factor into the $C_{FFFB}$ that is computed as provided herein and described relative to FIG. 1, and thereafter employed as a basis for feedback and/or control to the process system 12. According to FIG. 2, such feed-forward correction, $C_{FF}$, can also be removed and/or decoupled from the actual command or offset data to allow the I vector, referenced in FIGS. 1, 2, and/or 3, to be unaffected by the feed-forward correction.

The disclosed methods and systems can thus compute a control command for the process system 12 based upon historical event database data, and compensate such control based on reticle-induced errors when such historical data may be completely associated with the process system's reticle (e.g., query provides sufficient data associated with the query-specified reticle ID), partially associated with the process system's reticle (e.g., query provides data from multiple reticles that include the query-specified reticle ID), and/or completely unassociated with the process system's reticle (e.g., query provides data from one or more reticles, none of which include the query-specified reticle ID).

Those of ordinary skill also recognize that the methods and systems exemplified by the illustrations, including FIGS. 1, 2, and 3, are intended to facilitate an understanding of the disclosed methods and systems, and thus, can be altered without affecting the scope of the disclosed methods and systems. For example, results from a query of the event database 28 can cause a query of the reticle table 40 such that reticle-induced errors can be extracted and a command vector computed based on a weighted moving average of the event database data that can be adjusted based on the reticle table data. Accordingly, the reticle table 40 may be considered to be accessed by or otherwise included in the illustrated correlator module 26, and it can be understood that one or more databases can be employed to store at least A vectors, $E_g$ vectors, and reticle-induced errors.

Further, those with ordinary skill will recognize other variations of the disclosed methods and systems. For example, in one embodiment, the process system 12 may provide process system data directly to the event database 12 (e.g., "A" vector data). Similarly, the measurement system 14 may also provide data directly to the event database 12. In an embodiment, an entry of measurement system data to the event database 12 can cause a computation of an error vector $E_g$ as provided in the illustrated systems, where upon completion of the $E_g$ computation, $E_g$ can be associated with process systems data (e.g., "A" vector data) in the event database 12. As provided herein, I data can thereafter be determined from the associated A vector data and $E_g$ vector data. In some embodiments, such A and/or $E_g$ data can also be associated with reticle-induced error data to facilitate the computation of $C_{FFFB}$ as provided herein. Accordingly, and as provided herein, in some embodiments, the reticle table 40 can be incorporated, integrated, and/or otherwise associated with the event database 28.

FIG. 3 presents one illustrative system and method that can be based on FIGS. 1 and/or 2 and provides additional control for systems and methods according to FIGS. 1 and/or 2, where the process system 12 can be a system that can be affected by reticle-induced errors and/or includes a reticle, such as, for example, a lithography and/or photolithography system. Systems and methods according to FIG. 3 can be based on a consideration that photomask or reticle-induced errors can be considered static relative to other process system 12 errors that may be considered dynamic. Accordingly, systems and methods according to FIG. 3 may allow a user to query an event database (not shown in FIG. 3) or other similar data management system(s) based on hierarchical rules, wildcarding, etc., as provided previously herein with respect to FIGS. 1 and/or 2. The disclosed methods and systems thus allow for a computation of a weighting measure of the feedback request, based at least on the number of events identified by a feedback request and/or query.

In one embodiment, a weighting measure of the feedback can be based on, for example, the "square root of N," where N is the number of events retrieved based on the query. It can be understood that other variations on the number of events can be used, and the aforementioned weighting measure can be scaled and/or augmented by integer and/or non-integer numbers. In one example embodiment, a weighting measure can be expressed as 10* (square root of N), although other scale factors can be used as previously provided herein. Such weighting measure can be stored and/or otherwise associated with a query and/or reticle to which it is associated, such that a history of queries and associated weighting measures can be subsequently retrieved by a user. In one embodiment, such storage can be provided by an event database 28. Furthermore, the disclosed methods and systems can allow for a computation of a weighting measure for different levels of hierarchical queries, regardless of the number of events that may be retrieved for the different levels.

In the disclosed methods and systems, weighting measures for feedback can be used to computer a quality of a reticle bias state estimate. Accordingly, a reticle bias feedback qualify factor, referred to herein as "QF", can be expressed as a combination of weighting measures associated feedback requests that are further associated with a given reticle. For example, in some embodiments, the weighting measures can be normalized based on the number of weighting measures associated with a given reticle. Further, the QF or quality factor associated with the reticle can be a combination of such normalized weighting measures. In one example and as provided herein, the combination can include a square root of a sum of squares of normalized weighting measures, although such combination is merely for illustrative purposes, and other combinations can be employed without departing from the scope of the disclosed methods and systems.

In one embodiment of the disclosed methods and systems, a user can input and/or otherwise provide one or more data elements that can include a "use" criteria and/or threshold, a "stop-learning" criteria and/or threshold, other criteria that may be employed in assessing a reticle bias state estimate based on a quality factor, QF. One such "other criteria" can be, for example, determining that a quality factor for a given reticle bias state estimate may not be updated unless a recently computed quality factor is a comparative improvement over one or more prior quality factors associated with that same reticle. As an example, consider that on a first day, a user query specifies a reticle A, a device ID, and a technology ID, but otherwise wildcards other constraints and/or search keys. Also consider that on a second day, a user (same or another) specifies only reticle A, but otherwise wildcards other constraints and/or search keys. Both queries to the event database (e.g., see FIGS. 1 and/or 2) may include a different number of query results depending upon the event database, and hence can provide a different weighting measure and hence quality factor for an associated reticle bias state estimate. If a quality factor associated with the estimate from the second day for reticle A, is comparatively improved from the quality factor associated with the error estimate from the first day for that same reticle A, then the reticle A bias error estimate and associated quality factor for the second day can be stored in a database and/or memory (e.g., reticle table 40) and may be used (e.g., depending upon other criteria) for feedback and/or feedforward. Alternatively, an opposite result may cause the reticle A bias error estimate to fail to be updated based on the query of the second day.

As provided previously herein, other criteria and/or thresholds that can be used may include a use threshold and a stop-learning threshold. It can be understood that the use of "use" and "stop-learning" is merely for reference purposes, and other names can be employed without departing from the scope of the disclosed methods and systems. In the example embodiments provided herein, a "use" threshold can be associated with a user-specified and/or provided criteria such that, when a quality factor associated with a reticle bias state estimate exceeds (and/or equals) the use threshold, the associated reticle bias state estimate can be employed in a feedforward/feedback system as provided in FIGS. 1, 2, and/or 3, for example. Alternately and similarly, if a quality factor is less than the use threshold, such associated reticle bias state estimate may not be employed in the feedforward/feedback request; however, the reticle bias state estimate data and associated quality factor may be entered into a database regardless, providing that other criteria are satisfied (e.g., the most recently computed quality factor exceeds a prior computed quality factor).

A "stop-learning" threshold can be employed to prevent a reticle bias state estimate from being updated when a quality factor associated with a given reticle and query produces a quality factor that is equal to or exceeds a stop-learning threshold. In an embodiment where a stop-learning threshold exceeds the use threshold, and a data query provides a reticle bias state estimate with an associated quality factor that exceeds both thresholds, the disclosed methods and systems may employ the stored reticle bias state estimate, and fail to do further updating of the reticle bias state estimate. The optional and example stop-learning threshold can thus be understood to be a constraint on updating of stored reticle bias state data, rather than a constraint on use of the stored reticle bias state data.

For an embodiment of the disclosed methods and systems that employs a use and a stop-learning threshold as provided herein, and further, a tiered and/or hierarchical querying methodology, as provided previously herein, a weighting measure can be computed for the different levels/tiers, such that the different weighting measures can be compared and the largest weighting measure employed to identify a query that may be used to compute an updated reticle bias state estimate, including for example, an updated qualify factor associated with such updated reticle bias estimate. As provided herein, whether a database is updated based on the selected and/or identified query can be based on whether such newly computed/updated quality factor exceeds an associated stop-learning threshold; and, whether the reticle bias state estimate is employed to satisfy the feedback request can be governed by an associated use threshold.

Figure 4:
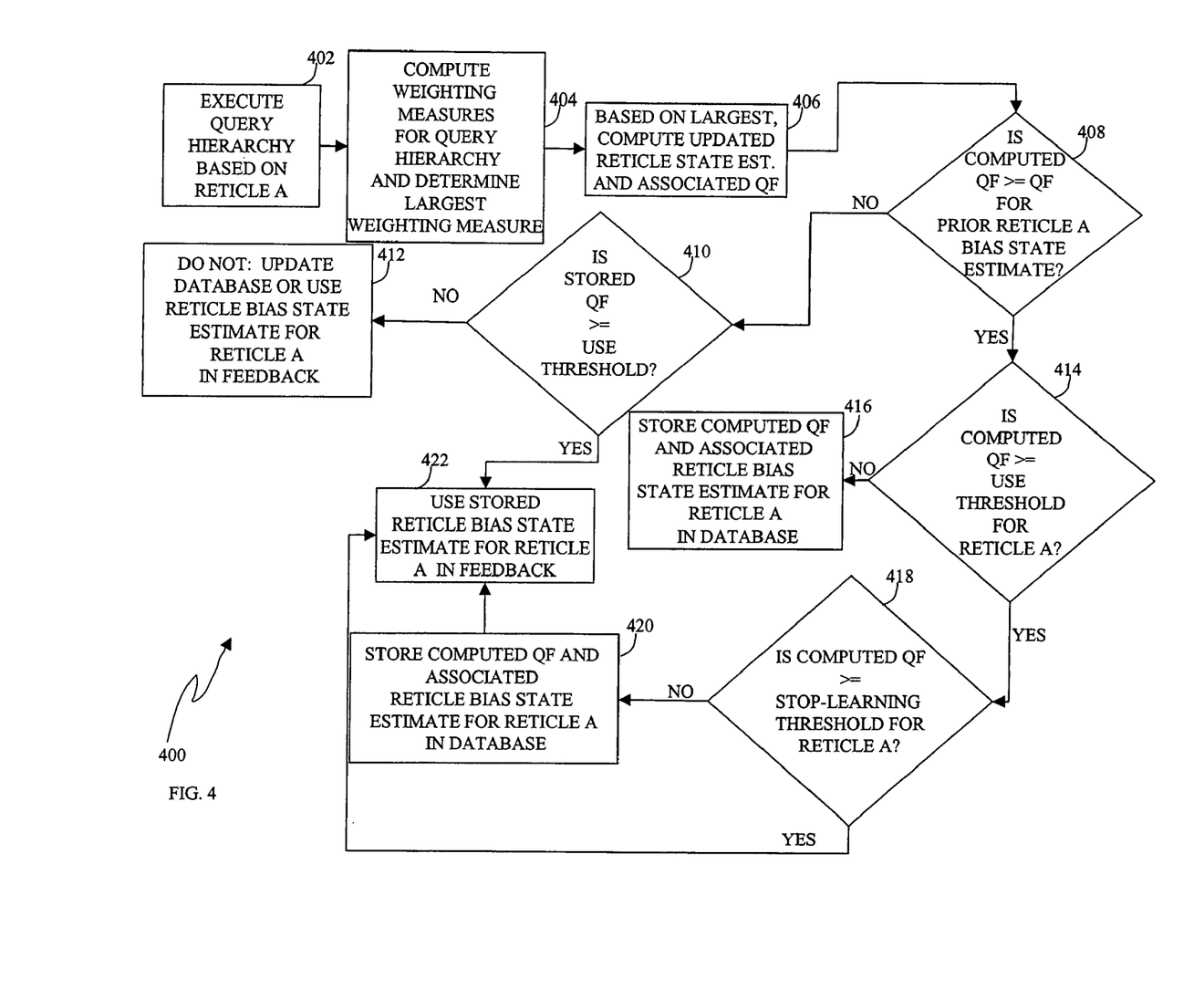
FIG. 4 is an example logic flow diagram for updating and/or selecting a reticle bias state estimate based on an associated quality factor.

FIG. 4 provides one flow diagram 400 of a system and method for providing a reticle bias state for systems and methods that employ both a use threshold and a stop learning threshold. As FIG. 4 indicates, a query such as a hierarchical query can be executed 402 to provide data from an event database, for example, for one or more queries that can be presented in a hierarchical format. For systems and methods according to FIG. 3, it may be understood that the query must include a specified reticle ID, overlay process model ID, and/or a CD process model ID (i.e., such parameters may not be "wildcarded"), while other parameters such as exposure tool ID, device ID, technology ID, layer ID, route ID, and operator ID, can be allowed to have default and/or wildcard values.

In one embodiment, the query results can be presented to a filter, such as a band-pass filter, that receive as input modeled historical data for certain modeled terms in a query (e.g., x-translation error, y-translation error, etc.). An example filter can be of the form of (filter mean)+k(filter sigma), and the constant "k" can be fixed, variable (e.g., adaptable), and/or user-defined. Accordingly, query response data not within the pass-band of the filter may not be provided for further computation, etc.

The results of the different queries can be provided to a module to compute a weighting measure based on the different query results 404. Based on the one or more computed weighting measures, a largest (or other selected) weighting measure can be determined 404 and a reticle bias state estimate updated based thereon, with a corresponding computation of a quality factor to be associated with the updated reticle bias state estimate 406. If the QF associated with the updated reticle bias state estimate is not greater than a QF for a prior reticle bias state estimate (e.g., of the database) 408, then the disclosed methods and systems can determine whether the prior, stored reticle bias state estimate is greater than the use threshold 410; and, if the stored reticle bias state estimate is greater than the use threshold, the feedback request may provide the stored reticle bias state estimate 422 to the process system 12. Alternately, if the stored QF is not greater than the use threshold at 410, then the disclosed embodiment may not update the database or provide a feedback that contains a reticle bias state estimate 412.

With continued reference to FIG. 4, and the decision shown at 408, if the computed QF is greater than the QF for a prior (e.g., stored) reticle bias state estimate, then such computed reticle bias state estimate QF can be compared to the use threshold associated with the reticle 414, and if the computed QF is not greater than the use threshold, such computed QF and associate reticle bias state estimate can be stored and associated with data for the reticle 416. Such data can be stored in a database and/or other memory structure 416, and such database can associate the reticle (e.g., identifier), quality factor (QF), error vector data (e.g., "E" vector data), process system data (e.g., "A" vector data), and other data. Returning again to the decision at 414, if the computed QF is greater than or equal to the use threshold for the given reticle, then the computed QF can be compared to the stop-learning threshold 418. If the computed QF is greater than the stop-learning threshold for the given reticle, then in the FIG. 4 embodiment, the reticle bias state estimate stored in the database 422 can be employed in the feedback request; alternately, the database can be updated 420 (e.g., with the reticle bias state estimate, associated QF, and/or other data) and the updated reticle bias state estimate can be employed in the feedback request 422. As provided previously herein, it can be understood that the elements of FIG. 4 can be rearranged, combined, and/or further separated without departing from the scope of the disclosed methods and systems.

In one embodiment, such as the embodiment shown in FIG. 3, computation of the reticle bias state estimate and other quantities can be based on the process system data (e.g., A vector data). For example, as provided with reference to FIGS. 1 and 2, and with continued reference to FIG. 3, process system data can be stored in an A-vector database and/or table 302. It can be understood that subscripts of (i-1, i-n) in FIG. 3 can refer to values i-1 to i-n that may be employed for feedback for the $j^{th}$ lot of a process for different reticles, for example, where n is the total number of feedback lots. Further subscripts of (j-1, j-n) in FIG. 3 can refer to values j-1 to j-n, where j is the historical feedback data pertaining to a given reticle.

As shown in FIG. 3, error data can be stored in a database and/or table 304 and can be differentiated based on a given reticle such that error data for different reticles, $E_{(i-1,\ i-n)}$ can be distinguished from error data for a given reticle, $E_{(j-1,\ j-n)}$, for which the feedback request corresponds. Input bias tables 48 and gain tables 22 can be accessed to provide data, via setpoint methods 306a–6 and gain methos 308a–b, respectively, to provide bias and gains to the respective error vectors, $E_{(j-1, i-n)}$ and $E_{(j-1, j-n)}$. The set point bias data 48 can also be known or referred to as an input bias and can control the process system 12 to regulate to a non-zero value. In a photolithography embodiment, an input/set point bias could compensate for a known etch process bias, for example. The error vector data pertaining to the given reticle, $E_{G(j-1, j-n)}$ can be provided to a reticle learning module 310 that can perform the following computations:

$$A_r = C_{r(j-1, j-n)} + (A_{(j-1, j-n)} - C_{FFFB(j-1, j-n)}), \quad (1)$$

where:

$A_r$ is corrected process system data for the given reticle;

$C_{r(j-1, j-n)}$ is the reticle correction factor for the given reticle;

$A_{(j-1, j-n)}$ is the process system data related to the given reticle; and, $C_{FFFB(j-1, j-n)}$ is the feed forward, feedback control for the given Further, the reticle learning module 310 can computed an "I" vector by differencing the corrected process system data, $A_r$, and the error vector data for the given reticle, $E_{G(j-1, j-n)}$, or $$Ir = A_r - E_{G(j-1, j-n)}. \quad (2)$$

The reticle bias state estimate can thereafter be computed according to:

$$B_r = W_i I_r / \text{Sum}(W_i), \quad (3)$$

where:

$W_i$ are the normalized weighting measures for different feedback requests, where $W_1$ can be expressed as $Q_j \text{SUM}(Q_i \ldots Q_n)$, and $Q_i$ can be expressed as the aforementioned weighting measures (e.g., 10*sqrt(N));

N is the number of $I_r$ vectors.

A quality factor, QF, associated with $B_r$ can thus be expressed as:

$$QF = \text{sqrt}(Q_1^2 + Q_2^2 \ldots + Q_n^2) \quad (4)$$

As provided with respect to FIG. 4, for example, such quality factor can be compared to other factors previously computed for the same reticle (e.g., which may be stored in the reticle bias table 310), use threshold, stop learning threshold, and/or other criteria as previously provided herein.

It can be understood that in some embodiments, a use, stop-learning, and/or other criteria can be specified by a user and applied against different reticles/reticle IDs, while in some embodiments, different reticles can be associated with different use, stop-learning, and/or other criteria. Furthermore, in some embodiments, a use can set and/or reset a quality factor, QF, associated with a reticle via a user interface or other mechanism, and such setting and/or resetting can be accomplished upon and/or after initialization of systems and methods according to FIGS. 1, 2, and/or 3. In some embodiments, for example, setting a quality factor for a given reticle to zero may indicate that the state of the reticle bias state estimate is known. It can be understood that in some instances, a user or another may wish to set the (stored, database) quality factor for a given reticle to a use threshold so that "learning" can continue, however, because the stored quality factor equals the use threshold, the stored reticle bias state estimate can be used.

Referring again to FIG. 3, the illustrated system and method can include an output bias 44 that can also be known as a feed-forward bias, and in a lithography process system 12 that includes an exposure tool, such bias can represent a bias to compensate a bias produced by a known characteristic of the material entering the process system 12, where the process system 12 can be, for example, an exposure tool. In an illustrative system, if the mean thickness of the nitride layer for a particular group of wafers has been measured, a bias can be provided to compensate for the thickness difference.

As shown by FIG. 3, the illustrated methods shown as 306a–b, 308a–b, 312 can be understood to be processes such as queries for extracting from a respective database and/or memory, data sufficient to aid in the processing as provided by FIG. 3. As provided previously herein with respect to other Figures, one of ordinary skill in the art can recognize that the components of FIG. 3 are merely illustrative, and can be otherwise combined, rearranged, and/or further separated, in whole or in part, without departing from the scope of the disclosed methods and systems.

What has thus been described are systems and methods that include methods and systems for estimating a reticle bias state for a process system, that include computing a difference between control data provided to the process system and error data based on at least one output of the process system, and estimating the reticle bias state based on weighted measures associated with the control data, where the weighted measures are based on the number of data points included in the difference. The methods and systems also include associating a reticle bias state estimate with a first quality factor, computing at least one weighted measure based on a number of data elements associated with the reticle, using the at least one weighted measure to provide a computed reticle bias state estimate and an associated computed quality factor, and, comparing the computed quality factor with the first quality factor to determine whether to update the reticle bias state estimate with the computed reticle bias state estimate.

The methods and systems described herein are not limited to a particular hardware or software configuration, and may find applicability in many computing or processing environments. The methods and systems can be implemented in hardware or software, or a combination of hardware and software. The methods and systems can be implemented in one or more computer programs, where a computer program can be understood to include one or more processor executable instructions. The computer program(s) can execute on one or more programmable processors, and can be stored on one or more storage medium readable by the processor (including volatile and non-volatile memory and/or storage elements), one or more input devices, and/or one or more output devices. The processor thus can access one or more input devices to obtain input data, and can access one or more output devices to communicate output data. The input and/or output devices can include one or more of the following: Random Access Memory (RAM), Redundant Array of Independent Disks (RAID), floppy drive, CD, DVD, magnetic disk, internal hard drive, external hard drive, memory stick, or other storage device capable of being accessed by a processor as provided herein, where such aforementioned examples are not exhaustive, and are for illustration and not limitation.

The computer program(s) can be implemented using one or more high level procedural or object-oriented programming languages to communicate with a computer system; however, the program(s) can be implemented in assembly or machine language, if desired. The language can be compiled or interpreted.

As provided herein, the processor(s) can thus be embedded in one or more devices that can be operated independently or together in a networked environment, where the network can include, for example, a Local Area Network (LAN), wide area network (WAN), and/or can include an intranet and/or the internet and/or another network. The network(s) can be wired or wireless or a combination thereof and can use one or more communications protocols to facilitate communications between the different processors. The processors can be configured for distributed processing and can utilize, in some embodiments, a client-server model as needed. Accordingly, the methods and systems can utilize multiple processors and/or processor devices, and the processor instructions can be divided amongst such single or multiple processor/devices.

The device(s) or computer systems that integrate with the processor(s) can include, for example, a personal computer(s), workstation (e.g., Sun, HP), personal digital assistant (PDA), handheld device such as cellular telephone, laptop, handheld, or another device capable of being integrated with a processor(s) that can operate as provided herein. Accordingly, the devices provided herein are not exhaustive and are provided for illustration and not limitation.

References to "a microprocessor" and "a processor", or "the microprocessor" and "the processor," can be understood to include one or more microprocessors that can communicate in a stand-alone and/or a distributed environment(s), and can thus can be configured to communicate via wired or wireless communications with other processors, where such one or more processor can be configured to operate on one or more processor-controlled devices that can be similar or different devices. Use of such "microprocessor" or "processor" terminology can thus also be understood to include a central processing unit, an arithmetic logic unit, an application-specific integrated circuit (IC), and/or a task engine, with such examples provided for illustration and not limitation.

Furthermore, references to memory, unless otherwise specified, can include one or more processor-readable and accessible memory elements and/or components that can be internal to the processor-controlled device, external to the processor-controlled device, and/or can be accessed via a wired or wireless network using a variety of communications protocols, and unless otherwise specified, can be arranged to include a combination of external and internal memory devices, when such memory can be contiguous and/or partitioned based on the application. Accordingly, references to a database can be understood to include one or more memory associations, where such references can include commercially available database products (e.g., SQL, Informix, Oracle) and also proprietary databases, and may also include other structures for associating memory such as links, queues, graphs, trees, with such structures provided for illustration and not limitation.

References to a network, unless provided otherwise, can include one or more intranets and/or the internet. References herein to microprocessor instructions or microprocessor-executable instructions, in accordance with the above, can be understood to include programmable hardware.

Unless otherwise state, use of the word "substantially" can be construed to include a precise relationship, condition, arrangement, orientation, and/or other characteristic and deviations thereof as understood by one of ordinary skill in the art, to the extent that such deviations do not materially affect the disclosed methods and systems.

Throughout the entirety of the present disclosure, use of the articles "a" or "an" to modify a noun can be understood to be used for convenience and to include one, or more than one of the modified noun, unless otherwise specifically stated.

Elements, components, modules, and/or parts thereof that are described and/or otherwise portrayed through the figures to communicate with, be associated with, and/or be based on, something else, can be understood to so communicate, be associated with, and or be based on in a direct and/or indirect manner, unless otherwise stipulated herein.

Although the methods and systems have been described relative to a specific embodiment thereof, they are not so limited. Obviously many modifications and variations may become apparent in light of the above teachings. For example, some embodiments may use pattern density, otherwise known as photomask density, in a feedforward in an etch or CMP process.

Many additional changes in the details, materials, and arrangement of parts, herein described and illustrated, can be made by those skilled in the art. Accordingly, it will be understood that the following claims are not to be limited to the embodiments disclosed herein, can include practices otherwise than specifically described, and are to be interpreted as broadly as allowed under the law.

What is claimed is:

1. A method for estimating a reticle bias state for a process system, the method comprising:
    computing a difference between control data provided to the process system and error data based on at least one output of the process system, and,
    estimating the reticle bias state based on weighted measures associated with the control data,
    where the weighted measures are based on the number of data points included in the difference.

2. A method according to claim 1, where the weighted measures include normalized weighted measures.

3. A method according to claim 1, where the weighted measures are based on the square root of the number of data points included in the difference.

4. A method according to claim 3, where the weighted measures are multiplied by a constant factor.

5. A method according to claim 1, where estimating the reticle bias state includes normalizing the reticle bias state estimate.

6. A method according to claim 5, where normalizing the reticle bias state estimate includes normalizing based on a sum of the weighted measures.

7. A method according to claim 1, further comprising associating the reticle bias state estimate with a quality factor.

8. A method according to claim 7, where the quality factor is based on a sum of the squares of the weighted measures.

9. A method according to claim 7, where the quality factor is based on a square root of a sum of the squares of the weighted measures.

10. A method according to claim 7, further comprising comparing the associated quality factor with at least one threshold.

11. A method according to claim 10, where the at least one threshold includes at least one of:
    a use threshold to determine whether to provide the reticle bias state estimate to the process system, and,
    a stop-learning threshold to determine whether to continue updating the reticle bias state estimate.

12. A method according to claim 7, further comprising comparing the associated quality factor with a previously computed quality factor associated with a previously computed reticle bias state estimate, where the previously computed reticle bias state estimate corresponds to the same reticle as the associated quality factor.

13. A method according to claim 12, further comprising performing a second comparing between the associated quality factor and at least one threshold.

14. A method according to claim 13, where the at least one threshold includes at least one of:

a use threshold to determine whether to provide the reticle bias state estimate to the process system, and, a stop-learning threshold to determine whether to continue updating the reticle bias state estimate.

15. A method according to claim 12, where based on the comparing, the previously computed quality factor associated reticle bias state estimate are updated.

* * * * *